United States Patent [19]
Chang

[11] Patent Number: 5,952,720
[45] Date of Patent: Sep. 14, 1999

[54] BURIED CONTACT STRUCTURE

[75] Inventor: Tsun-Tsai Chang, Hsin-Chu, Taiwan

[73] Assignee: United Microelectronics Corp., Taiwan

[21] Appl. No.: 08/851,248

[22] Filed: May 5, 1997

Related U.S. Application Data

[60] Provisional application No. 60/016,950, May 6, 1996.

[51] Int. Cl.⁶ .......................... H01L 29/76; H01L 29/94; H01L 31/062; H01L 27/082
[52] U.S. Cl. .......................... 257/744; 257/382; 257/368; 257/588; 257/408
[58] Field of Search ...................................... 257/382, 383, 257/344, 744, 408, 368–369, 588–596, 533; 438/596, 564, 533

[56] References Cited

U.S. PATENT DOCUMENTS

| | | | |
|---|---|---|---|
| 4,648,937 | 3/1987 | Ogura et al. | 156/643 |
| 5,086,017 | 2/1992 | Lu | 437/200 |
| 5,126,285 | 6/1992 | Kosa et al. | 438/533 |
| 5,206,532 | 4/1993 | Roberts | 257/382 |
| 5,294,822 | 3/1994 | Verrett | 257/368 |
| 5,349,229 | 9/1994 | Wei et al. | 257/383 |
| 5,453,635 | 9/1995 | Hsu et al. | 257/344 |
| 5,607,881 | 3/1997 | Huang | 438/533 |
| 5,608,240 | 3/1997 | Kumagai | 257/408 |
| 5,698,883 | 12/1997 | Mizuno | 257/408 |
| 5,712,503 | 1/1998 | Kim et al. | 257/408 |

*Primary Examiner*—Tom Thomas
*Assistant Examiner*—Cuong Q Nguyen
*Attorney, Agent, or Firm*—Rabin & Champagne, P.C.

[57] ABSTRACT

A buried contact structure is provided for forming a contact between a source/drain region of a MOSFET and polysilicon conducting line. The polysilicon conducting line is formed on a field oxide region and extends onto the surface of the semiconductor substrate near the source/drain region. A polysilicon sidewall structure is formed in contact with the vertical edge of the polysilicon conducting line and the horizontal surface of the source/drain region to provide contact between the polysilicon conducting line and the source/drain region.

11 Claims, 4 Drawing Sheets

BURIED CONTACT STRUCTURE

This application claims priority from provisional application Ser. No. 60/016,950, filed May 6, 1996.

BACKGROUND OF THE INVENTION

1. Field of the Invention

The present invention relates to metal oxide semiconductor field effect transistor (MOSFET) circuits and, more particularly, to a buried contact used for source and drain interconnects.

2. Description of the Related Art

Very large scale integration (VLSI) has allowed the semiconductor industry to reduce cost while still increasing performance of advanced integrated circuit devices. This trend has been fueled mainly by the ability of the semiconductor industry to reduce the size of structures within devices, thus producing denser circuits. Photolithography advancements in the form of more advanced cameras, as well as more sensitive photoresist materials, have played a major role in the ability to create smaller images on semiconductor chips. In addition, developments in plasma technologies have allowed submicrometer images in photoresist to be transferred accurately to underlying materials, via the use of anisotropic reactive ion etching (RIE). The use of ion implantation and low pressure chemical vapor deposition (LPCVD) have also been responsible for the creation of smaller, faster integrated circuit devices.

Specific structure and processes have also contributed to the reduction in device sizes. A technique for creating submicrometer sidewall images, and the ability to transfer these submicrometer images to underlying materials, has been described by Ogura, et al., in U.S. Pat. No. 4,648,937. A major application of the Ogura invention has been the insulator sidewall passivation of polysilicon gates, allowing for decreased spacing between the polysilicon gate and the source/drain contacts to be realized. In another attempt to reduce drain size, Lu in U.S. Pat. No. 5,086,017 has presented a method for reducing the amount of source/drain area needed for metal contacts.

Another method used to reduce device size has been the buried contact process for the source and drain elements of MOSFETs. This process connects a doped source/drain region of a MOS device to an intermediate layer consisting of polysilicon or another conductive material and then connects the intermediate layer to a metal or other conductive layer, thereby forming a contact to source/drain regions through a layer of an intermediate conductive material. The contact between the polysilicon and metal is usually made over one of the thick field oxide regions, thus preserving area on the substrate. A conventional process for forming a buried contact to a source/drain region within a MOS device circuit, as well as the contact formed by that process, are illustrated in FIGS. 1–7 of the present application. Referring first to FIG. 1, a P-type substrate 10 has a field oxide region 12 on its surface to isolate active device regions, a gate oxide layer 14 over the illustrated active device region and a thin (~800 Å) layer of polysilicon 16 over the entire surface of the device. The buried contact will be formed on the surface of the substrate 10 adjacent the field oxide region 12 of the device. A photoresist mask 18 is formed over the thin polysilicon layer 16 to have an opening 20 extending laterally away from the field oxide region 12. The portion of the polysilicon layer 16 exposed by the opening 20 in the photoresist mask 18 is removed by etching, the exposed portion of the gate oxide 14 is removed by additional etching and then the photoresist mask is removed by ashing to provide the structure shown in FIG. 2.

A second layer of polysilicon 24, typically thicker than the first polysilicon layer 16 as shown in FIG. 3, is deposited over the device so as to be in contact with the first polysilicon layer 16 and the exposed portion 22 of the substrate. A mask 26 is formed over the second polysilicon layer 24. The mask 26 is formed with an opening 28 that will be used to define in part the lateral extent of the MOSFET gate electrode as well as the source/drain region of the MOSFET device. The portion of the polysilicon layer 24 exposed within the mask opening 28 is etched, followed by the portion of the first polysilicon layer 16 within the mask opening 28, and then the gate oxide within the mask opening 28 is etched. During this process, a notch 30 (shown in FIG. 4) is generally formed near the edge of the polysilicon gate electrode and extending below the surface of the substrate where the substrate is not covered by the gate electrode and gate oxide. The mask 26 is then removed to produce the structure illustrated in FIG. 4. A thin layer of oxide (not shown, 200 to 300 Å) is then grown over the surface of the of the polysilicon layer 24 and over the surface of the source/drain region 34.

Ions 32 are implanted into the polysilicon layer 24 and into the exposed portion of the substrate to form the more lightly doped portion of a lightly doped drain (LDD) structure 34. A layer of oxide 42 (2500 to 3000 Å) is deposited over the device (FIG. 5), generally by chemical vapor deposition (CVD), and then an anisotropic oxide etch is performed to provide an oxide spacer 44 alongside the gate oxide 36 and gate electrode 38 and alongside the polysilicon conducting line 40. Note here that the polysilicon gate electrode 38 and polysilicon contact electrode 40 are illustrated as single layers, because they are made up of similar polysilicon layers 16 and 24. After the anisotropic etch back to form the oxide spacers 44 and 46, the more heavily doped section of the LDD source/drain region 34 is formed by implanting ions 48. The portion of doped polysilicon conducting line 40 extending over the surface of the source/drain region 34 provides the buried contact to the source/drain region.

FIG. 7 presents a plan view of the FIG. 6 buried contact structure. The intermediate polysilicon conducting line 40 extends from the field oxide region 12 and onto the surface of the source/drain region 34. Spacer oxide region 46 extends around the periphery of intermediate conducting line 40, at least above the source/drain region 34. Typically, a conducting line formed from a metal such as aluminum is then provided in contact with the layer 40 to provide a connection between the source/drain region 34 and other portions of the circuit. A large overlap between the polysilicon conducting line 40 and the source/drain region 34 is conventionally necessary to provide a sufficiently low contact resistance for the illustrated structure. Because the area of the contact between the polysilicon 40 and the source/drain region 34 determines the resistance of the contact structure, it is typically desirable to increase the size of the contact region. However, this makes the size of the cell undesirably large. In addition, the resistance of the illustrated contact structure varies with changing contact size, so that the resistance of the illustrated structure varies undesirably with alignment and other types of errors.

In general, although buried contact schemes are useful in reducing device sizes, schemes such as that illustrated in FIGS. 1–7 are complex, resulting in increased costs per chip. It is accordingly preferred to provide a simpler and less complex process for obtaining buried contacts to the source and drain regions in advanced MOSFET circuits.

SUMMARY OF THE PREFERRED EMBODIMENTS

In one embodiment, the present invention provides an integrated circuit including a buried contact structure. The integrated circuit is formed on a semiconductor substrate having field isolation regions to isolated active device regions of the integrated circuit. A gate insulator is formed on a surface of the semiconductor substrate and a gate electrode formed on the gate insulator. A source/drain region is formed adjacent an edge of the gate electrode and to extend from the edge of the gate electrode toward a field isolation region. A conducting line extends over a portion of the field isolation region with an edge of the conducting line extending above the source/drain region and a conducting sidewall structure is in contact with the edge of the conducting line and in contact with the source/drain region.

In another embodiment, the present invention provides an integrated circuit including a buried contact structure. The integrated circuit is formed on a semiconductor substrate having field isolation regions to isolated active device regions of the integrated circuit. A gate insulator is formed on a surface of the semiconductor substrate and a gate electrode formed on the gate insulator. A source/drain region is formed adjacent an edge of the gate electrode and to extend from the edge of the gate electrode toward a field isolation region. A polysilicon conducting line is formed on the field isolation region so that part of the polysilicon conducting line extends onto the semiconductor substrate adjacent the field isolation region. A polysilicon sidewall structure contacts the polysilicon conducting line and in contact with the source/drain region.

BRIEF DESCRIPTION OF THE DRAWINGS

The advantages and implementation of this invention are best explained in the preferred embodiments with reference to the attached drawings that include.

DESCRIPTION OF THE PREFERRED EMBODIMENTS

Preferred embodiments of the present invention provide a buried contact which connects conductive wiring to highly doped contact regions within semiconductor devices. More particularly, embodiments of the present invention include a buried contact of the type often used to make contact to source/drain regions of MOSFET devices within static random access memory (SRAM) devices. In preferred embodiments of the present invention, a polysilicon sidewall spacer structure provides a contact between the highly doped source/drain region and an intermediate polysilicon layer that connects to another conductor such as a metal line. Use of such a polysilicon spacer structure provides a more compact electrical connection than is provided in conventional buried contact structures. In addition, because the substrate below the polysilicon spacer is doped before the polysilicon spacer is formed, a better contact is formed than is typical for conventional buried contact structures.

Figure 8:
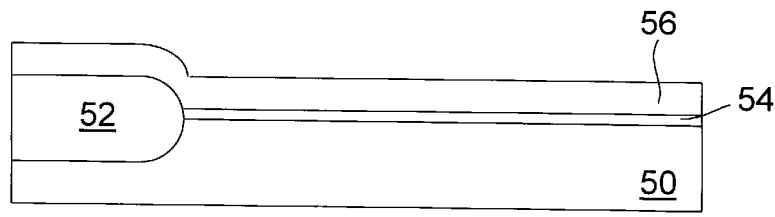
FIGS. 8–13 schematically illustrate, in partial cross-section, stages in the manufacture of a device in accordance with the present invention.
Figure 9:
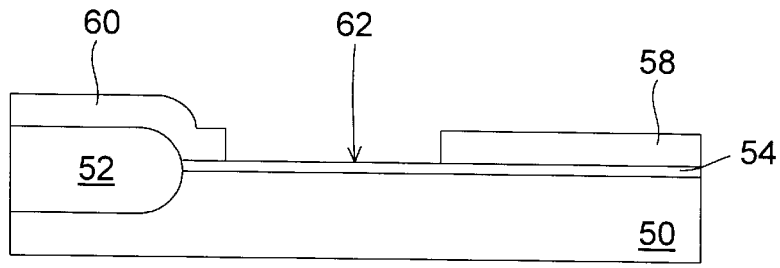

A method for forming MOSFETs using a buried contact process is now described. Because the described process can be applied to MOSFET devices now being manufactured, only aspects necessary to a complete understanding of the invention will be described in detail. A particularly preferred embodiment of the present invention provides a static random access memory (SRAM) have at least one buried contact region like those described herein Referring now to FIG. 8, a device such as an SRAM is formed on a P-type silicon substrate 50. Thick field oxide (FOX) regions 52 are formed surrounding the active device regions to provide device isolation. The method commonly practiced in the industry to form a field oxidation is to deposit a thin silicon dioxide layer on the substrate and to form an silicon nitride layer, which will be patterned into an oxidation mask, on the thin silicon dioxide layer. Conventional photolithography and etching procedures are used to remove the silicon nitride layer from the regions where the device isolating field oxidations are to be formed, leaving the silicon nitride/silicon oxide mask over the active device region. The portions of the substrate exposed by the mask are oxidized in a steam or other appropriate oxygen-rich ambient at a temperature between about 800–1000° C. to obtain a field oxide thickness of about 3000 to 6000 Å.

Figure 10:
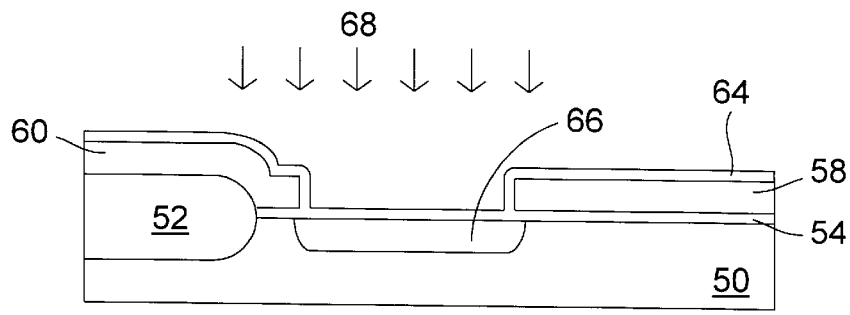

After removal of the silicon nitride layer in heated phosphoric acid and removal of the silicon oxide layer in a buffered hydrofluoric acid solution, the substrate is cleaned and a gate oxide 54 is grown at a temperature of about 850–950° C. to a thickness between about 90 to 180 Å. Next, a polysilicon layer is deposited by low pressure chemical vapor deposition (LPCVD) to a thickness of between about 2000 to 4000 Å. Photolithography and etching are performed to pattern the polysilicon layer 56 into a polysilicon gate 58, as well as to pattern a polysilicon conducting line 60 lying partially over the field oxide region 52 and extending a distance onto the gate oxide layer 54 above the surface of the substrate 50. After photoresist removal and the proper wet organic and inorganic clean-up steps, the polysilicon gate electrode 58 and the polysilicon conducting line 60 are oxidized in an oxygen ($O_2$) ambient at a temperature of between about 850–900° C. to grow a layer of silicon dioxide having a thickness of between about 100 to 300 Å over their surfaces. The thin oxide layer is schematically shown in FIG. 10 as layer 64. The region between the polysilicon structures indicated in the figure as 62 that is already covered by the gate oxide layer 54, grows an additional thickness of silicon dioxide during this oxidation procedure so that the area 62 now has a total silicon dioxide thickness between about 200 to 500 Å.

Figure 11:
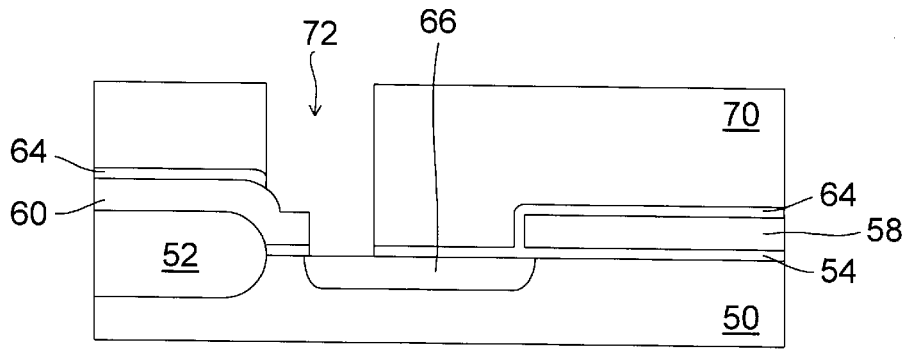

A lightly doped portion of an LDD source/drain region 66 (FIG. 10) is formed by implantation of phosphorus ions 68 at an energy between about 40–80 KeV to a dose of between about $1 \times 10^{13}$ ions/cm$^2$ to $4 \times 10^{13}$ ions/cm$^2$. A photoresist mask 70 (FIG. 11) is formed having an opening 72 which exposes a portion of the gate oxide layer 54 above the source/drain region 66 adjacent to the polysilicon conducting line 60. A subsequent oxide etch step removes a portion of gate oxide 54 to expose a portion of the polysilicon conducting line 60 and to expose the surface of the substrate within the source/drain region 66. Note that a portion of the gate oxide remains underneath the polysilicon conducting line 60. The buried contact structure will be formed within the opening 72 on the source/drain region 66 and adjacent the polysilicon conducting line 60. Preferably, the width of opening 72 is between about 5000 to 10000 Å.

Figure 12:
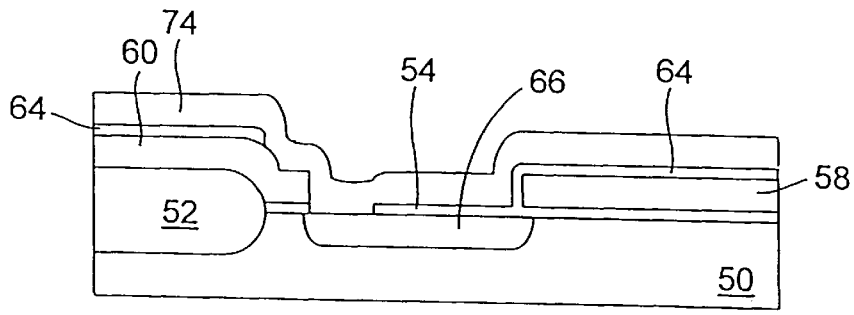

After the photoresist mask 70 is removed, a polysilicon layer 74 is formed by LPCVD to a thickness of approximately 1500 to 3000 Å over the oxide layers 54, 64, over the exposed portion of the polysilicon conducting line 60 and over the exposed portion of the source/drain region 66. The structure shown in FIG. 12 is then subjected to anisotropic reactive ion etching (RIE) using, for example, an etchant derived from HBr gas, to etch back the polysilicon layer 74 and to form the polysilicon sidewall spacer structure 76 along the polysilicon conducting line 60, forming a contact between the polysilicon conducting line 60 and the source/drain region 66. This RIE process also forms a polysilicon spacer 78 along the gate electrode 58 that is isolated from the substrate 50 by the gate oxide 54 and isolated from the gate electrode 58 by a remaining portion of oxide layer 64. Next, a heavier dosage ion implantation is performed into the source/drain region 67 using arsenic ions at an energy of 40–80 KeV to a dosage of $2\times10^{15}$ ions/cm$^2$ to $6\times10^{15}$ ions/cm$^2$. The sidewall spacer structures 76, 78 define the lateral extent of the second, heavier source/drain implantation and so define the LDD structure. The polysilicon gate structure 58, the polysilicon conducting line 60 and the polysilicon sidewall spacer 76 are also doped to become highly conductive at this time.

Figure 13:
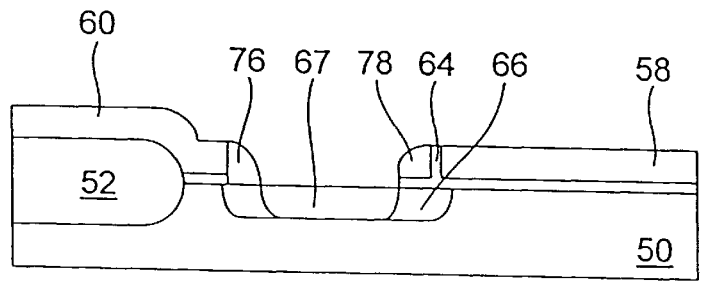
Figure 14:
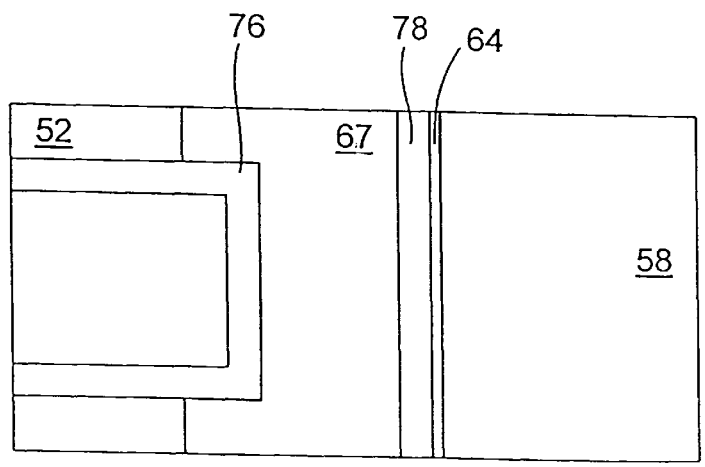
FIG. 14 plan view of the partial cross-section shown in FIG. 13.

FIG. 14 shows a plan view of the FIG. 13 structure. The portion of the polysilicon sidewall spacer 76 lying on the source/drain region 66 provides the contact between the polysilicon land region 60 and the source/drain region 66, 67. This portion of the polysilicon sidewall 76 is formed on a surface of the source/drain region 66 that is lightly doped prior to the deposition of the polysilicon layer which is formed into the sidewall spacer 76. Accordingly, a higher doping level and deeper dopant distribution is provided under the polysilicon sidewall spacer 76 than is typically provided when the substrate is doped by diffusion of impurities from an overlying polysilicon layer.

Further processing continues in the conventional manner, with the deposition of a thick silicon oxide film by atmospheric pressure CVD (APCVD) to a thickness of between about 4000 to 8000 Å. Conventional photolithography and RIE processing are used to form contact vias, including vias extending down to the polysilicon conducting line 60. Metallization, consisting for example of aluminum or an aluminum alloy, is deposited over the surface of the device by, for example, sputtering, and extending down to the polysilicon conducting line 60. The deposited metal layer is then patterned to form contacts in the conventional manner.

Figure 1:
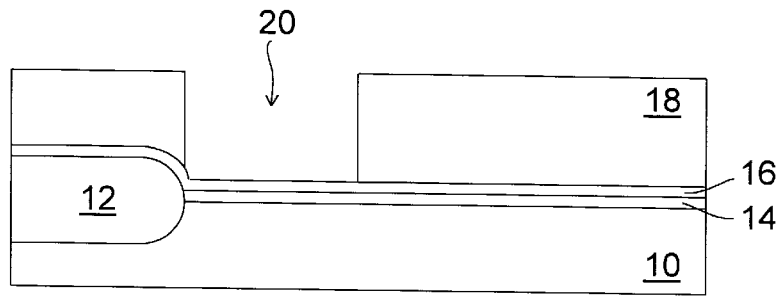
FIGS. 1–6 schematically illustrate, in partial cross-section, stages in the manufacture of a conventional MOSFET device having polysilicon contacts to the source and drain regions.
Figure 2:
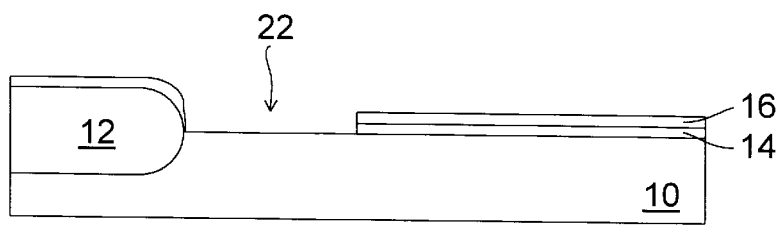
Figure 3:
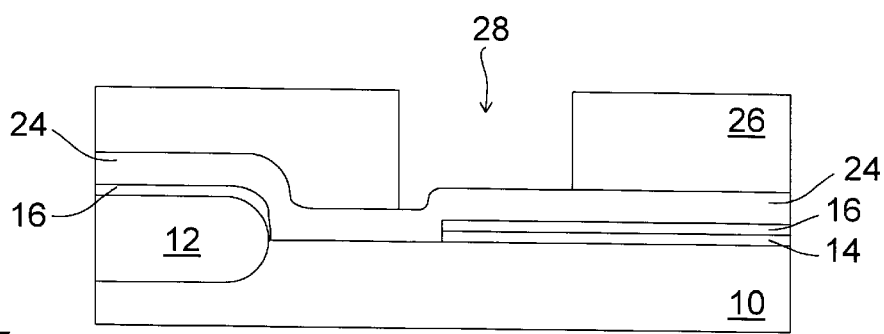
Figure 4:
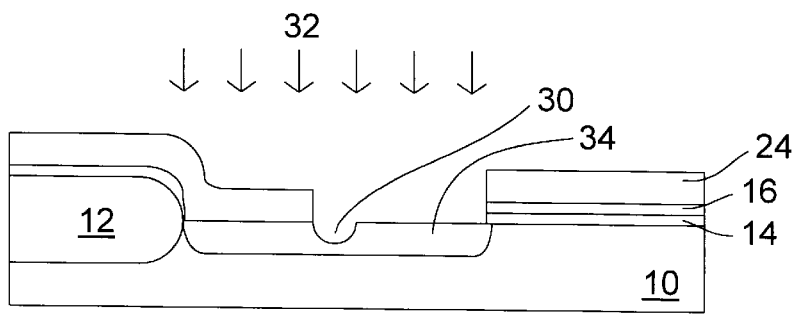
Figure 5:
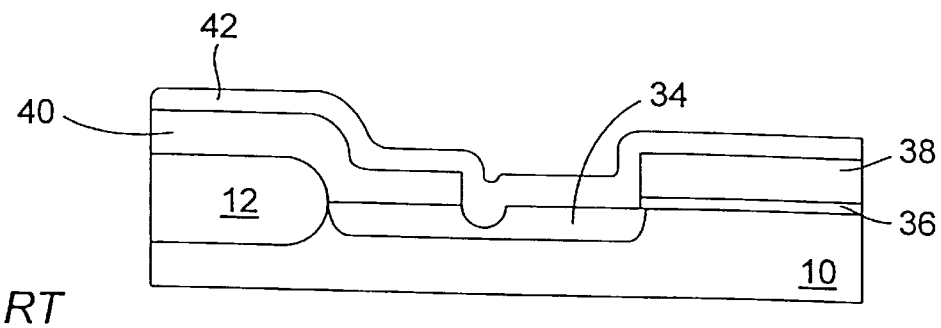
Figure 6:
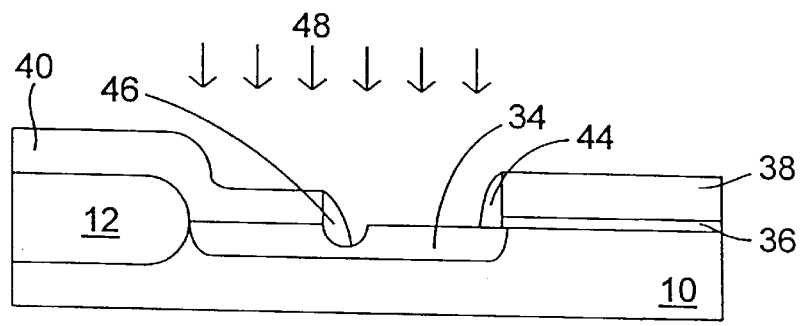
Figure 7:
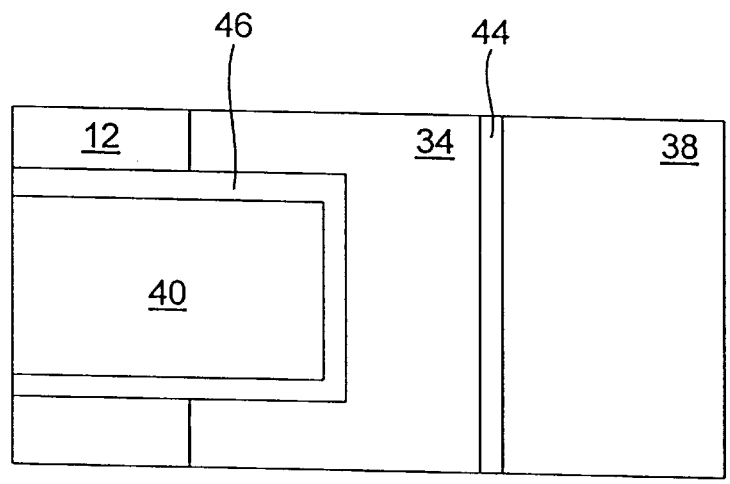
FIG. 7 is a plan view of the partial cross-section shown in FIG. 6.

The buried contact region formed in this manner can be made smaller than the conventional contact, and more reliably provides an appropriately low resistance contact. In addition, the technique used to form the polysilicon sidewall contact is more readily manufactured than the conventional buried contact structure. Referring to the FIG. 10 embodiment of the present invention, it can be seen that the source/drain region is formed selfaligned to the edges of both the gate electrode 58 and the polysilicon conducting line 60. The polysilicon sidewall region 76 is formed as a spacer adjacent the edge of the polysilicon conducting line 60 (FIGS. 12 and 13), so that the polysilicon sidewall region is necessarily formed over the source/drain region 66. By contrast, the conventional buried contact structure relies on implantation (FIGS. 4 and 6) through the polysilicon conducting line 40 to render conducting the portion of the source/drain region 34 lying under the conducting line. It is typically impractical to maintain critical control of the length of the polysilicon conducting line 40, so that the resistivity of the contact structure varies undesirably. This difficulty is compounded by the tendency in the conventional buried contact structure to form a notch 30 in the source/drain region. Accordingly, embodiments of the present invention provide both a more reliable contact resistance and also desirably avoid formation of the notch structure in the source/drain region.

The process used to create the buried contact structure can be applied to N-type or P-type (PMOS or NMOS) devices, as well as to complimentary (CMOS and BiCMOS) structures. While this invention has been described with reference to certain particularly preferred embodiments, it will be understood by those skilled in the art that various changes in form and details may be made without departing from the spirit and scope of this invention.

What is claimed:

1. An integrated circuit including a buried contact structure, the integrated circuit comprising:
   a semiconductor substrate having field isolation regions formed thereon to isolate active device regions of the integrated circuit;
   a gate insulator formed on a surface of the semiconductor substrate;
   a gate electrode formed on the gate insulator;
   a source/drain region formed adjacent an edge of the gate electrode and extending from the edge of the gate electrode toward a field isolation region, and including a heavily doped area, and a plurality of lightly doped areas, with said heavily doped area being between and bordered by respective ones of said lightly doped areas;
   a conducting line over a portion of the field isolation region, an edge of the conducting line extending above the source/drain region; and
   a conducting sidewall spacer structure in contact with the edge of the conducting line and in contact with only the lightly doped area of the source/drain region, the conducting sidewall spacer structure having an uppermost edge formed even with an upper surface of the conducting line, whereby the upper surface of the conducting line and the heavily doped area of the source/drain region are not covered by said conducting sidewall spacer structure.

2. The integrated circuit of claim 1, further comprising a layer of insulating material between the conducting line and the semiconductor substrate adjacent the field isolation region.

3. The integrated circuit of claim 1, wherein the conducting sidewall spacer structure contacts the semiconductor substrate along the edge and along two sides of the conducting line.

4. An integrated circuit including a buried contact structure, the integrated circuit comprising:
   a semiconductor substrate having field isolation regions formed thereon to isolate active device regions of the integrated circuit;
   a gate insulator formed on a surface of the semiconductor substrate;
   a gate electrode formed on the gate insulator;
   a source/drain region formed adjacent an edge of the gate electrode and extending from the edge of the gate electrode toward a field isolation region, and including a heavily doped area, and a plurality of lightly doped areas, with said heavily doped area being between and bordered by respective ones of said lightly doped areas;
   a polysilicon conducting line on the field isolation region, part of the polysilicon conducting line extending onto the semiconductor substrate adjacent the field isolation region; and a polysilicon sidewall spacer structure in contact with an edge of the polysilicon conducting line and in contact with only the lightly area of the source/drain region, the polysilicon sidewall spacer structure having an uppermost edge formed even with an upper surface of the polysilicon conducting line.

5. The integrated circuit of claim 4, wherein the source/drain region has a lightly doped drain structure consisting of the heavily doped region and the lightly doped regions, at least one of the lightly doped regions extending laterally beyond the heavily doped region at a surface of the semiconductor substrate.

6. The integrated circuit of claim 5, wherein the polysilicon sidewall spacer structure has a lower edge aligned with an interface between the lightly doped and heavily doped regions of the source/drain region.

7. The integrated circuit of claim 4, wherein the field isolation region consists of a LOCOS field oxide.

8. The integrated circuit of claim 7, wherein the polysilicon sidewall spacer structure extends along sides of the polysilicon conducting line onto the field isolation region.

9. The integrated circuit of claim 4, wherein the polysilicon sidewall spacer structure is in contact with the edge of the polysilicon conducting line along a vertical extent of the edge of the polysilicon conducting line, and wherein a lower surface of the polysilicon sidewall structure contacts a horizontal surface of the source/drain region.

10. The integrated circuit of claim 4, wherein a layer of insulating material lies between the polysilicon conducting line and the semiconductor substrate adjacent the polysilicon sidewall spacer structure.

11. The integrated circuit of claim 1, wherein the conducting sidewall spacer structure has a lower edge aligned with an interface between the lightly doped and heavily doped areas of the source/drain region.

* * * * *